US012477660B2

(12) United States Patent
Reiter et al.

(10) Patent No.: US 12,477,660 B2
(45) Date of Patent: Nov. 18, 2025

(54) CONNECTING DEVICE AND METHOD FOR PRODUCING A CONNECTING DEVICE

(71) Applicant: Vitesco Technologies GmbH, Regensburg (DE)

(72) Inventors: Jens Reiter, Munich (DE); Eugenia Herdt, Munich (DE); Holger Schlotter, Munich (DE)

(73) Assignee: Vitesco Technologies GmbH, Regensburg (DE)

( * ) Notice: Subject to any disclaimer, the term of this patent is extended or adjusted under 35 U.S.C. 154(b) by 279 days.

(21) Appl. No.: 18/133,312

(22) Filed: Apr. 11, 2023

(65) Prior Publication Data

US 2023/0328894 A1  Oct. 12, 2023

(30) Foreign Application Priority Data

Apr. 12, 2022 (DE) ...................... 10 2022 203 680.8

(51) Int. Cl.
*H05K 3/34* (2006.01)
*H05K 1/18* (2006.01)

(52) U.S. Cl.
CPC ............... *H05K 3/34* (2013.01); *H05K 1/18* (2013.01); *H05K 2201/10272* (2013.01); *H05K 2201/10409* (2013.01)

(58) Field of Classification Search
CPC .......... H05K 1/02; H05K 1/0263; H05K 1/18; H05K 2201/10272; H05K 2201/10409;

(Continued)

(56) References Cited

U.S. PATENT DOCUMENTS 5,065,283 A * 11/1991 Adachi ................ H05K 1/0263
439/84
6,140,591 A * 10/2000 Osborne ................ H05K 7/142
174/138 E (Continued)

FOREIGN PATENT DOCUMENTS

DE  202011005385 U1  8/2011
DE  102012021323 A1  4/2014

(Continued)

OTHER PUBLICATIONS

German Examination Report for German Application No. 10 2022 203 680.8, dated Dec. 23, 2022 with translation, 6 pages.

*Primary Examiner* — Tuan T Dinh
(74) *Attorney, Agent, or Firm* — Buchanan Ingersoll & Rooney PC

(57) ABSTRACT

A connecting device for connecting a printed circuit board to a busbar is provided, having: a printed circuit board and a busbar connecting element which has a base body with a first side for bearing on the busbar, and a second side, situated opposite the first side, for contacting the printed circuit board. The busbar connecting element moreover has at least two anti-twist sections which are connected to the base body on the second side of the base body, extend from the second side of the base body into a respective recess formed in the printed circuit board, and engage in the respective recess in such a way that the busbar connecting element and the printed circuit board are held non-rotatably relative to each other.

13 Claims, 3 Drawing Sheets

(58) Field of Classification Search
CPC .... H01R 43/0256; H01R 43/16; H01R 12/55; H01R 12/58; H01R 12/707; H01R 12/7082
USPC ................ 361/756–759, 807–810, 775–778
See application file for complete search history.

(56) References Cited

U.S. PATENT DOCUMENTS

| | | |
|---|---|---|
| 11,259,416 B2 | 2/2022 | Brodbeck et al. |
| 2021/0194231 A1* | 6/2021 | Tanouchi ............... H01R 12/58 |

FOREIGN PATENT DOCUMENTS

| | | |
|---|---|---|
| DE | 102014010374 A1 | 1/2015 |
| DE | 102013022242 A1 | 7/2015 |
| DE | 102014211317 A1 | 12/2015 |
| DE | 102014222951 A1 | 5/2016 |
| DE | 102017124812 A1 | 4/2019 |

* cited by examiner

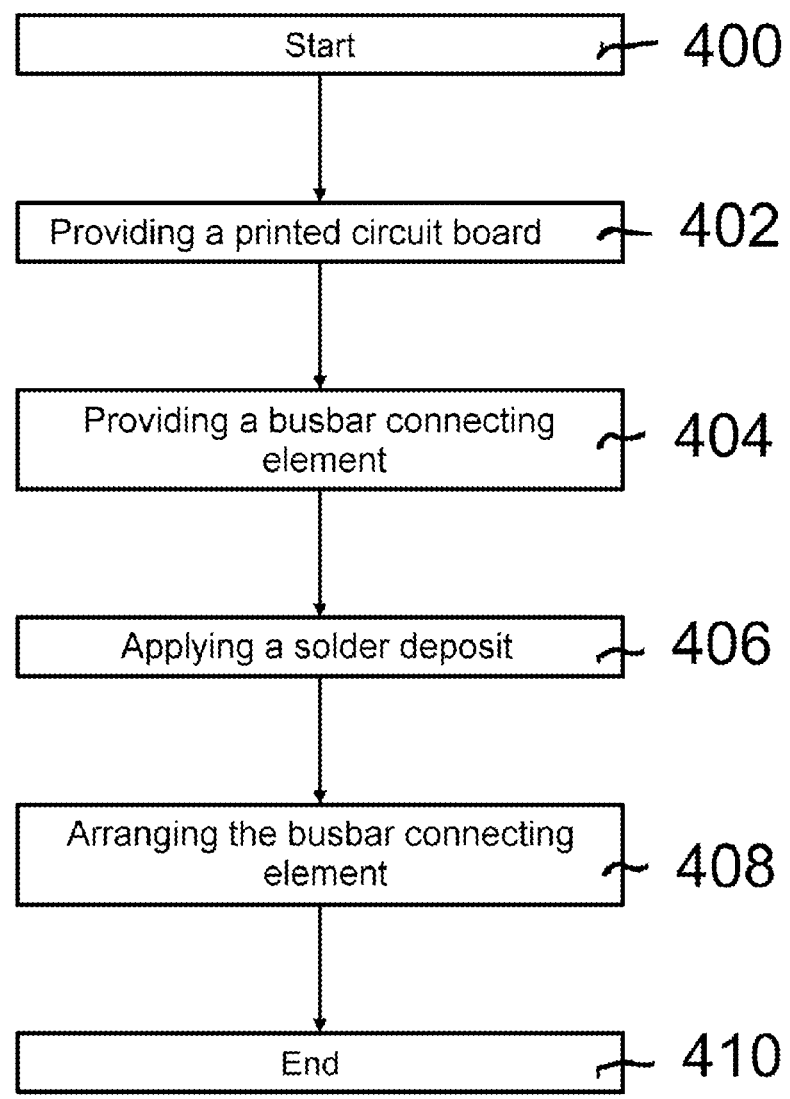

CONNECTING DEVICE AND METHOD FOR PRODUCING A CONNECTING DEVICE

CROSS REFERENCE TO RELATED APPLICATIONS

This application claims priority to German Patent Application No. 10 2022 203 680.8, filed Apr. 12, 2022, the contents of such application being incorporated by reference herein.

FIELD OF THE INVENTION

The present invention relates to a connecting device and also to a method for producing a connecting device.

BACKGROUND OF THE INVENTION

Current-carrying conductive connections between a printed circuit board and a busbar can be produced in many fashions. Screw connections are a common variant in power electronics. It has, however, been shown that, in particular in the case of a screw connection the required mechanical stability cannot always be ensured.

SUMMARY OF THE INVENTION

An aspect of the present invention is a connecting device for connecting a printed circuit board to a busbar and which is characterized by an increased mechanical stability of the connection. A further aspect of the present invention is a method for producing such a connecting device of this kind.

According to a first aspect of the present invention, a connecting device for connecting a printed circuit board to a busbar is provided. The connecting device comprises a printed circuit board and a busbar connecting element which has a base body with a first side for bearing on the busbar, and a second side, situated opposite the first side, for contacting the printed circuit board. The busbar connecting element moreover has at least two, in particular separate anti-twist sections which are connected to the second side of the base body, in particular as a single piece, extend from the second side into a respective recess formed in the printed circuit board, and engage in the respective recess in such a way that the busbar connecting element and the printed circuit board are held non-rotatably relative to each other.

The connecting device according to an aspect of the invention is based at least partially on the insight that twisting of the busbar connecting element relative to the printed circuit board is prevented as far as possible by the provision of anti-twist sections which engage non-rotatably with respective recesses of the printed circuit board. A connecting device which is characterized by increased mechanical stability is consequently produced.

The busbar connecting element is here formed in particular from an electrically conductive material and the recesses in the printed circuit board are designed in particular as electrically conductive vias such that a current-carrying electrically conductive connection to the printed circuit board can be produced when the busbar is connected to the busbar connecting element.

It is particularly advantageous if the at least two anti-twist sections are each dimensioned in such a way that an in particular annular gap, which is filled with a soldering agent in such a way that the anti-twist sections are soldered to the printed circuit board, is present between a respective outer side of a respective anti-twist section and a respective inner side of a respective recess. Because an in particular annular gap is present between the outer side of a respective anti-twist section and the inner side of a respective recess, in the case where torque is applied to the anti-twist sections, the soldering agent present in the annular gap is subject in particular also to compressive stress and not just shear stress. Because the layer of solder is subject to compressive stress and not just shear stress, an improved mechanical stability results in comparison with a soldered connection which is subject just to shear stress.

It is further advantageous if the second side of the base body has a bearing surface for bearing on an upper side of the printed circuit board and this bearing surface is at least partially soldered to the upper side of the printed circuit board. This preferred embodiment is based at least partially on the recognition that the bearing surface of the busbar connecting element can be used as a bearing abutment when populating the printed circuit board with the busbar connecting element.

It is further advantageous if the base body has a center axis extending from the first side to the second side and the at least two anti-twist sections are arranged evenly distributed circumferentially about the center axis. A uniform force distribution on the busbar connecting element is achieved as a result.

It is particularly advantageous if the at least two anti-twist sections have a same radial spacing from the center axis.

It is further advantageous if a respective anti-twist section extends into a respective recess by a length which is smaller than a thickness of the printed circuit board. As a result, anti-twist sections are prevented from protruding on the underside of the printed circuit board. If the underside of the printed circuit board is plane, the attachment of an insulating layer or a cooling component to the underside of the printed circuit board is simplified. In practise, this can be achieved for example by the fact that, although the length of a respective anti-twist section matches a thickness of the printed circuit board, the length of a respective anti-twist section is dimensioned with a negative tolerance and the thickness of the printed circuit board is dimensioned with a positive tolerance.

It is further advantageous if the base body has a blind hole, with an internal thread, extending from the first side in the direction of the second side. The busbar can consequently be fastened to the busbar connecting element by means of screws. The blind hole additionally prevents chips, which may generate a short circuit on the printed circuit board, from getting caught in the blind hole and from coming into contact with the printed circuit board.

It is further advantageous if the base body has on its outer side at least one tool engagement surface for the engagement of a mounting tool. This enables in particular the busbar connecting element to be oriented relative to the recesses in the printed circuit board and can be used for population, in particular SMD population, of the printed circuit board.

According to a second aspect of the present invention, a method for producing a connecting device for connecting a printed circuit board to a busbar is provided. The method has the following steps: Providing a printed circuit board with at least two in particular separate, spaced-apart recesses; providing a busbar connecting element which has a base body with a first side for bearing on the busbar and a second side, situated opposite the first side, for contacting the printed circuit board, wherein the busbar connecting element moreover has at least two in particular separate anti-twist sections which are connected on the second side of the base body to the base body, in particular as a single part, and extend from the second side in the direction of the printed circuit board; and arranging the busbar connecting element on the printed circuit board in such a way that a respective anti-twist section is arranged non-rotatably in a respective recess.

According to an advantageous embodiment of the method, before the busbar connecting element is arranged on the printed circuit board, a solder deposit is applied in an area around a respective recess, and after the busbar connecting element is arranged on the printed circuit board, the busbar connecting element is soldered to the printed circuit board. This preferred embodiment enables the production of a connecting device by means of a machine-assisted paste overprint (for example, with the aid of a template) together with an SMD-assisted soldering process. The connecting device can thus be produced in a fully automated fashion.

It is in particular advantageous if a solder quantity of the applied solder deposit is measured such that, when the busbar connecting element is soldered to the printed circuit board, a soldering agent flows into a gap between a respective outer side of a respective anti-twist section and a respective inner side of a respective recess in such a way that, when the busbar connecting element is soldered to the printed circuit board, both the second side of the base body is soldered to an upper side of the printed circuit board, and the outer side of a respective anti-twist section is soldered to the inner side of a respective recess.

Advantageous embodiments of the connecting device according to the invention represent advantageous embodiments of the method according to the invention and vice versa.

BRIEF DESCRIPTION OF THE DRAWINGS

Further features and aspects of the present invention will become apparent to a person skilled in the art by practising the present teaching and taking into consideration the accompanying drawings. In the drawings:

FIG. 4 shows a schematic view of flow diagram for carrying out an embodiment of a method according to the invention for producing a connecting device.

DETAILED DESCRIPTION OF THE PREFERRED EMBODIMENTS

Elements with the same function or construction are provided with the same reference signs throughout the figures.

Figure 1:
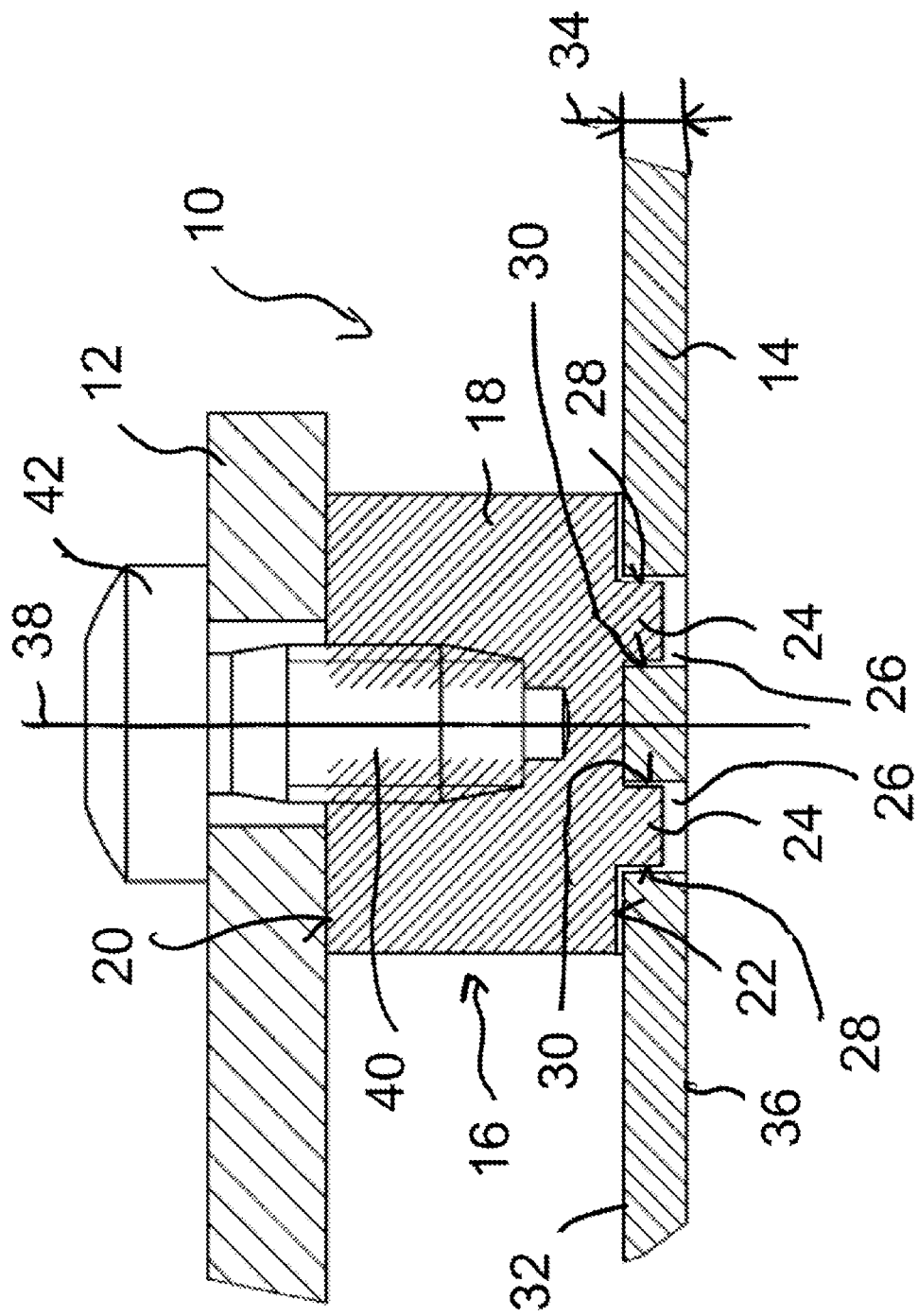
FIG. 1 shows a schematic view in section through one embodiment of a connecting device according to the invention.

Reference is made first to FIG. 1 which shows a schematic view in section of a connecting device 10. The connecting device 10 serves for the current-carrying conductive connection of a busbar 12 to a printed circuit board 14. Such connections can be used in particular in the case of power electronics components.

The connecting device 10 comprises the printed circuit board 14 and a busbar connecting element 16. The busbar connecting element 16 serves to connect the busbar 12 to the printed circuit board 14. The busbar connecting element 16 has a base body 18 which has a first side 20 for bearing on the busbar 12 and a second side 22, situated opposite the first side 20, for contacting the printed circuit board 14.

The busbar connecting element 16 additionally has a plurality of anti-twist sections 24. The anti-twist sections 24 are each connected on the second side 22 of the base body 18 to the base body 18 as a single part and extend from the second side 22 in the direction of the printed circuit board 14 such that they ultimately protrude from the second side 22.

The anti-twist sections 24 each project into a recess 26 present in the printed circuit board 14. The anti-twist sections 24 and the recesses 26 are adapted to one another in such a way that the anti-twist sections 24 are held non-rotatably in the recesses 26. Twisting of the anti-twist sections 24 relative to the printed circuit board 14 is prevented as far as possible because the anti-twist sections 24 engage with the recesses 26.

Each anti-twist section 24 is additionally dimensioned in such a way that an annular gap, which is filled with a soldering agent such that the respective outer side 28 is soldered to the respective inner side 30, is present between a respective outer side 28 of a respective anti-twist section 24 and a respective inner side 30 of a respective recess 26. Furthermore, there is a gap between an upper side 32 of the printed circuit board 14 and the second side 22 of the base body 18 which is also filled with soldering agent such that the upper side 32 is soldered to the second side 22. For the sake of clarity, the layer of solder present between the sides 28, 30 and the sides 22, 32 is not shown. The soldering of the sides 28, 30 and 22, 32 can happen, for example, in an SMD soldering process, as already mentioned.

Each anti-twist section 24 is moreover dimensioned in such a way that a length by which the respective anti-twist section 24 extends into a respective recess 26 of the printed circuit board 14 is smaller than a thickness 34 of the printed circuit board 14. It is consequently ensured that the anti-twist sections 24 do not protrude from an underside 36 of the printed circuit board, as a result of which the attachment of an insulating layer and/or a cooling component to the underside 36 of the printed circuit board 14 is facilitated.

As shown moreover in FIG. 1, in particular the busbar connecting element 16 has a center axis 38 which extends from the first side 20 to the second side 22. The anti-twist sections 24 have a same radial spacing from the center axis 38 and are arranged evenly distributed circumferentially about the center axis 38. At least two anti-twist sections 24 are provided per busbar connecting element 16. As shown in detail in connection with FIG. 2, in the specific example of FIGS. 1 and 2 three anti-twist sections 24 are provided which are arranged evenly distributed about the center axis 38. In other embodiments (not shown), two or more than three anti-twist sections 24 can also be provided.

As shown moreover in FIG. 1, the base body 18 of the busbar connecting element 16 has a blind hole 40 with an internal thread. The blind hole 40 extends from the first side 20 in the direction of the second side 22 and serves to receive a screw 42. The busbar 12 can be screwed to the busbar connecting element 16 by means of the screw 42. When the busbar 12 is fastened by the screw, inter alia a torque is exerted on the busbar connecting element 16 which is ultimately dissipated via the layer of solder present between the sides 28, 30. The layer of solder is here in particular also subject to compressive stress, namely between the sides 28, 30, and not just to shear stress. As a result, the mechanical stability of the layer of solder is increased in comparison with a layer of solder which has been subject just to shear stress, as in the case of the absence of anti-twist sections 24.

The busbar connecting element 16 is made in particular from a material which is electrically conductive. The recesses 26 are also designed as electrically conductive vias, as is well known to a person skilled in the art in the case of printed circuit boards. The screwing of the busbar 12 to the printed circuit board 14 via the busbar connecting element 16 enables a mechanically stable, current-carrying, and conductive connection which can be used in particular in power electronics.

Figure 2:
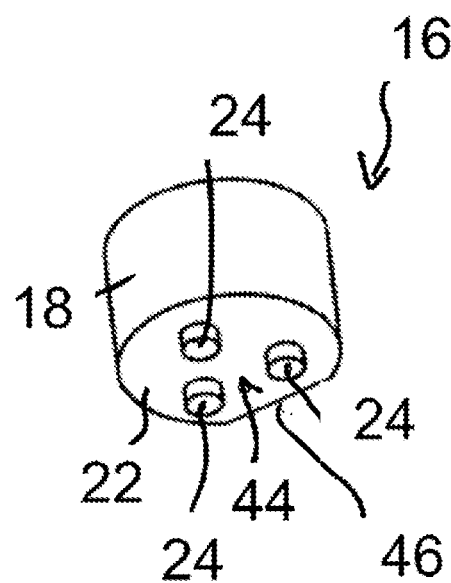
FIG. 2 shows a schematic view of a busbar connecting element.

Reference is now to be made to FIG. 2 which shows a schematic view of the busbar connecting element 16.

As can be seen in FIG. 2, the second side 22 of the base body 18 has an area designed as an abutment surface 44. The abutment surface 44 serves to bear against the upper side 32 of the printed circuit board 14 and represents a bearing abutment when the printed circuit board 14 is populated with the busbar connecting element 16.

As can also be seen in FIG. 2, the anti-twist sections 24 are designed as pins which are connected to the base body 18 as a single piece. The busbar connecting element 16 is configured, for example, as a turned part but can also be configured otherwise in other illustrations which are not shown.

As shown moreover in FIG. 2, the base body 18 has on its outer side at least one tool engagement surface 46 for engagement of a mounting tool. The tool engagement surface 46 enables, for example, the busbar connecting element 16 to be oriented with respect to the recesses in the printed circuit board and also facilitates the population of the printed circuit board by means of an SMD process.

Figure 3:
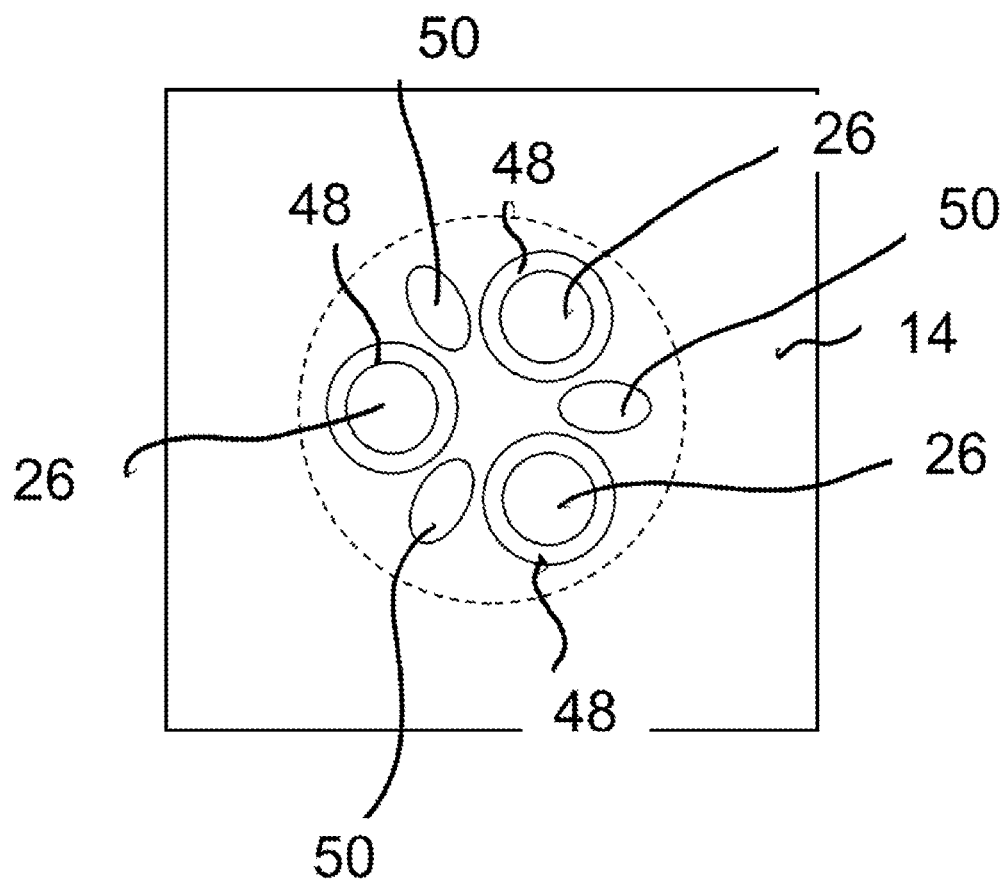
FIG. 3 shows a schematic plan view of a printed circuit board.

Reference is now to be made to FIG. 3, which shows a schematic plan view of a printed circuit board 14 before the busbar connecting element 16 is applied.

In the specific example of FIG. 3, the printed circuit board 14 has three recesses 26 for three anti-twist sections 24 (see FIG. 2) of the busbar connecting element 16. The dashed line shown in FIG. 3 here marks the area which is provided for the busbar connecting element 16. An area 48, which is filled with a deposit of solder, is provided around each recess 26. The quantity of the solder deposit is measured in such a way that, when the busbar connecting element 16 is soldered, soldering agent can flow into the gap between the sides 28, 30 such that both the sides 22, 32 and the sides 28, 30 are soldered to each other during the soldering. Although the recess 26 is surrounded completely by the area 48 in the specific example in FIG. 3, it is not excluded that the area 48 only partially surrounds the recess 36 in other embodiments (not shown).

Shown additionally in FIG. 3 is a further area 50 which is provided, for example, between the recesses 26 and can likewise be filled with soldering agent in order optionally to ensure a further large-area soldering of the surfaces 22, 32.

The shape, arrangement, and extent of the areas 48 and/or 50 are not restricted to the respective design shown in FIG. 3 and instead can be adapted to the respective use case. The area 48 and/or 50 can be filled with corresponding soldering agent, for example, by means of paste printing and a soldering stencil.

Reference is now made to FIG. 4 which shows a schematic view of a flow diagram for carrying out a method for producing, for example, the connecting device 10 in FIGS. 1 to 3.

The method starts with the step 400.

In the next step 402, a printed circuit board such as, for example, the printed circuit board 14 in FIGS. 1 to 3 is supplied. The printed circuit board 14 here has the already described recesses 26.

In the step 404, a busbar connecting element such as, for example, the busbar connecting element 16 in FIGS. 1 to 3 is supplied. The busbar connecting element 16 here has the already described anti-twist sections 24.

In the step 406, a deposit of solder is now applied to the printed circuit board 14, in particular in the already described areas 48, 50.

In the step 408, the busbar connecting element 16 is arranged on the printed circuit board 14 in such a way that the anti-twist sections 24 engage with the recesses 26. The busbar connecting element 16 is then soldered to the printed circuit board 14. This can be effected, for example, in an SMD soldering process.

The method finally ends with the step 410.

Although the recesses 26 and the anti-twist sections 24 have a circular shape in FIGS. 1 to 3, in other embodiments not illustrated the recesses 26 and the anti-twist sections 24 can have other shapes which are adapted to one another. The same applies for the base body 18 of the busbar connecting element 16. This too can have a different expedient shape.

The invention claimed is:

1. A connecting device for connecting a printed circuit board to a busbar having:
    a busbar connecting element which has a cylindrical base body with a first side for bearing on the busbar, and a second side, situated opposite the first side, for contacting the printed circuit board, wherein the busbar connecting element moreover has at least two anti-twist sections each of which are connected to the base body on the second side of the base body, and extend parallel to a longitudinal axis of the base body into a respective recess formed in the printed circuit board, and engage in the respective recess in such a way that the busbar connecting element and the printed circuit board are held non-rotatably relative to each other,
    wherein the at least two anti-twist sections are arranged circumferentially about the longitudinal axis of the base body.

2. The connecting device as claimed in claim 1, wherein the at least two anti-twist sections are each dimensioned in such a way that a gap between the recesses of the printed circuit board is filled with a soldering agent between a respective outer side of a respective anti-twist section and a respective inner side of a respective recess in such a way that the anti-twist sections are soldered to an upper side of the printed circuit board.

3. The connecting device as claimed in claim 1, wherein the second side of the base body has a bearing surface for bearing on an upper side of the printed circuit board and the bearing surface is soldered at least partially to the upper side of the printed circuit board.

4. The connecting device as claimed in claim 1, wherein the base body has a blind hole, extending from the first side in the direction of the second side, with an internal thread for screwing the busbar to the base body.

5. The connecting device as claimed in claim 1, wherein the base body has on an outer side of the base body at least one tool engagement surface for engagement of a mounting tool.

6. The connecting device as claimed in claim 1, wherein a soldering agent is disposed on an upper side of the circuit board between adjacent ones of the recesses in such a way that the second side of the base body is soldered to the upper side of the printed circuit board.

7. A connecting device for connecting a printed circuit board to a busbar having:
    a busbar connecting element which has a base body with a first side for bearing on the busbar, and a second side, situated opposite the first side, for contacting the printed circuit board, wherein the busbar connecting element moreover has at least two anti-twist sections which are connected to the base body on the second side of the base body, extend from the second side into a respective recess formed in the printed circuit board, and engage in the respective recess in such a way that the busbar connecting element and the printed circuit board are held non-rotatably relative to each other, wherein a respective anti-twist section extends into a respective recess by a length which is smaller than a thickness of the printed circuit board.

8. The connecting device as claimed in claim 7, wherein the base body has a center axis extending from the first side to the second side and the at least two anti-twist sections are arranged distributed circumferentially about the center axis.

9. The connecting device as claimed in claim 8, wherein the at least two anti-twist sections have a same radial spacing from the center axis.

10. A method for producing a connecting device for connecting a printed circuit board to a busbar, wherein the method comprises:

supplying a printed circuit board with at least two recesses spaced apart from each other;

supplying a cylindrical busbar connecting element which has a base body with a first side for bearing on the busbar, and a second side, situated opposite the first side, for contacting the printed circuit board, wherein the busbar connecting element moreover has at least two anti-twist sections each of which are connected to the base body on the second side of the base body and extend parallel to a longitudinal axis of the base body from the second side in the direction of the printed circuit board, the at least two anti-twist sections arranged circumferentially about the longitudinal axis; and arranging the busbar connecting element on the printed circuit board in such a way that each respective anti-twist section is arranged non-rotatably in a respective recess.

11. The method as claimed in claim 10, wherein, before the busbar connecting element is arranged on the printed circuit board, a solder deposit is applied in an area around a respective recess, and after the busbar connecting element is arranged on the printed circuit board, the busbar connecting element is soldered to the printed circuit board.

12. The method as claimed in claim 10, wherein a respective anti-twist section extends into a respective recess by a length which is smaller than a thickness of the printed circuit board.

13. The method as claimed in claim 11, wherein a solder quantity of the applied solder deposit is measured such that, when the busbar connecting element is soldered to the printed circuit board, a soldering agent flows into a gap between a respective outer side of a respective anti-twist section and a respective inner side of a respective recess in such a way that, when the busbar connecting element is soldered to the printed circuit board, both the second side of the base body is soldered to an upper side of the printed circuit board, and the outer side of a respective anti-twist section is soldered to the inner side of a respective recess.

* * * * *